United States Patent [19]

Yamanaka et al.

[11] 4,338,877
[45] Jul. 13, 1982

[54] APPARATUS FOR MAKING SEMICONDUCTOR DEVICES

[75] Inventors: Haruyoshi Yamanaka, Takarazuka; Masaru Kazumura, Takatsuki, both of Japan

[73] Assignee: Matsushita Electric Industrial Co., Ltd., Kadoma, Japan

[21] Appl. No.: 84,297

[22] Filed: Oct. 12, 1979

[30] Foreign Application Priority Data

Oct. 20, 1978 [JP] Japan ................... 53-129615

[51] Int. Cl.³ .............................. B05C 3/09
[52] U.S. Cl. ................... 118/421; 118/425; 118/429
[58] Field of Search ............ 118/412, 415, 421, 425, 118/429; 156/621, 622, 624; 134/61, 83; 148/171, 172

[56] References Cited

U.S. PATENT DOCUMENTS

| | | | |
|---|---|---|---|
| 3,753,801 | 8/1973 | Lockwood et al. | 118/415 X |
| 3,759,759 | 9/1973 | Solomon | 118/415 X |
| 3,879,235 | 4/1975 | Gatos et al. | 156/622 X |
| 4,123,302 | 10/1978 | Marinelli | 118/415 X |

FOREIGN PATENT DOCUMENTS

| | | |
|---|---|---|
| 2556928 | 6/1976 | Fed. Rep. of Germany . |
| 122153 | 9/1976 | German Democratic Rep. . |
| 52-11860 | 1/1977 | Japan ................... 118/415 |
| 460826 | 4/1977 | U.S.S.R. ................ 148/171 |

OTHER PUBLICATIONS

"Apparatus for Continuous Liquid Phase Epitaxy Growth", Blum et al., IBM Technical Disclosure Bulitia, vol. 15, No. 8, Jan. 1973.

*Primary Examiner*—John P. McIntosh
*Attorney, Agent, or Firm*—Cushman, Darby & Cushman

[57] ABSTRACT

An apparatus for making semiconductor devices comprising a block having a slot hole for holding a semiconductor substrate therein, a solution container which has a predetermined number of holes to contain semiconductor solutions therein and is slidably disposed on said block, characterized in that said slot hole has walls having a considerable angle with respect to a horizontal plane and has a solution inlet at the top part of said slot hole and a solution outlet at the bottom part of said slot hole, and has a means to hold said substrate with its principal face substantially parallel to said walls.

10 Claims, 7 Drawing Figures

APPARATUS FOR MAKING SEMICONDUCTOR DEVICES

BACKGROUND OF THE INVENTION

1. Field of the Invention

The present invention relates to a method and an apparatus for making semiconductor devices, especially for epitaxially growing several layers of crystal for use in semiconductor devices.

2. Description of the Prior Art

In recent years, technology of information conveyance is making a great progress, and above all, the art of light communication, which can transmit a large quantity of information with accuracy, attracts attention, and many experiments for actual use are now under way. Semiconductor lasers or light emitting diodes to be used in such light communication, should have a life of at least $10^6$ hours, since they are to be installed, for example, in long distance ocean light guide cables. In order to obtain such long life of the semiconductor devices such as lasers or light emitting diodes, it is very important to eliminate crystal imperfections of epitaxially grown crystal layers, especially those of the active region.

FIG. 1(a) shows a schematic sectional elevation view of a conventional apparatus used in making the semiconductor devices. The apparatus has a block 2 made of pure carbon, which holds a semiconductor substrate 1 in a recess on the principal (top) face thereof. A solution container 4 having a predetermined number of holes, which contains molten solutions 3 of semiconductor compounds or semiconductor mixed crystals, is slidably disposed on the upper face of the block 2. The apparatus of FIG. 1(a) is used in a manner that, at first the whole apparatus with material of the solution is heated to a predetermined temperature above the melting points of the solutions 3, and then the whole system is slowly cooled down at a predetermined cooling rate, and during the cooling down the solution container 4 is stepwisely slid towards the left side, thereby making the solutions 3 in the holes contact one by one to the principal surface of the substrate 1. Such type of the apparatus has the shortcomings that:

(1) since the depths, and hence quantities of the solutions which contact the substrate can not be accurately controlled by means of the structure of the apparatus, an accurate control of the epitaxially grown layers are difficult, (2) since non-solved lumps exist in the solution, accurate controlling of quantity of the solution is impossible, and (3) at sliding of the solution container 4, the surfaces of the epitaxially grown layers are undesirably scratched by edges of the solution holder 4 and the non-solved lumps, thereby damaging accuracy of the construction of the layers.

FIG. 1(b) shows a schematic sectional elevation view of another conventional apparatus used in making the semiconductor devices. The apparatus has a block 2' made of pure carbon, which holds a semiconductor substrate 1 in a recess on the principal face thereof. An overrider 9 which is also made of pure carbon is fixedly secured on the block 2'. The overrider 9 has a V-shaped bent hole, in the bottom of which the substrate 1 is disposed. A space 7 is connected to one end of a V-shaped bent hole 8 and has an opening 71 on the top thereof. The other end of the V-shaped hole 8 is made open to a waste solution depository. A piston 6 is provided in the opposite side in the space 7 to the V-shaped bent hole 8. A solution container 4 having a predetermined number of holes, and containing molten solutions 3 of semiconductor compounds or semiconductor mixed crystals, is slidably disposed on the upper face 91 of the overrider 9.

The apparatus of FIG. 1(b) is used as follows: At first, the whole system, and hence the solutions 3 are heated to a predetermined temperature, which is above the melting temperature of the solutions, and the solution container 4 is slid leftwards to such a position as to allow a first solution (in the leftmost hole) to be put into the space 7. Then the solution container 4 is slid again leftwards to such a position as to allow the bottom of a first isolation wall 41 between the solution containing holes to cover and seal the opening 71 of the space 7. Thereafter, the piston 6 is pushed leftwards, so that the first solution sealed in the space 7 is pushed leftwards into the V-shaped bent hole 8 and contacts the principal face of the semiconductor substrate 1, thereby making an epitaxial growth reaction to form an epitaxial layer of a predetermined thickness. Next, the piston 6 is pushed back rightwards and the solution container 4 is slid leftwards to such a position as to allow a second solution to be put into the space 7. Then the solution container 4 is slid again leftwards to such a position as to allow the bottom of the second isolation wall 42 to cover and seal the opening 71 of the space 7. Thereafter, the piston 6 is pushed leftwards, so that the second solution sealed in the space 7 is pushed down into the V-shaped hole 8, and hence pushes out the first solution which has been therein. By repeating the similar steps, all the solutions are made in contact with the face of the substrate 1 thereby making sequential epitaxial growths. Such type of the apparatus has the shortcomings that:

(1) since a solution is pushed out by a next solution, there are mixings of the solutions, resulting in forming of epitaxial layers which are different from a designed one, (2) since the piston 6 and V-shaped bent hole 8 are provided, the apparatus becomes complicated, and the process of the method becomes troublesome, and (3) since the V-shaped bent hole 8 is used, it is difficult to entirely remove the last solution from the surface of the substrate 1.

SUMMARY OF THE INVENTION

An object of the present invention is to provide an improved method and apparatus of manufacturing semiconductor device with epitaxial growth layers, which has no damages and has very low undesirable mixing of contents of different layers at the interfaces of the layers. A further object of the present invention is to provide an improved method and apparatus which enables manufacturing of semiconductor devices having a long life due to very low mixing of the layers.

Such objects are attainable according to the present invention, by disposing the substrate obliquely or vertically in an oblique or vertical narrow hole which is disposed with a considerable angle against horizontal line and has a solution inlet at the top part and a solution outlet at the bottom part.

DESCRIPTION OF THE PREFERRED EMBODIMENT

An apparatus for making semiconductor devices in accordance with the present invention comprises a block having at least a space for holding a semiconductor substrate therein, a solution container which has a predetermined number of holes to contain semiconductor solutions therein and is movably disposed on said block in a manner to sequentially dispose said space under said semiconductor solutions from selected holes, and is characterized in that said space is formed in a slot hole, which is defined by two substantially parallel walls disposed with an angle with respect to a horizontal plane, has a solution inlet at the top part of said tubular hole and has a solution outlet at the bottom part of said tubular hole, and said space semiconductor is disposed in a manner to hold said substrate with its principal face substantially parallel to the axis of said slot hole.

A method for making semiconductor devices in accordance with the present invention comprises steps of holding a semiconductor substrate in a slot hole having a predetermined size and an angle with respect to a horizontal plane in a manner that its principal face has an angle with respect to a horizontal plane, putting a semiconductor solution into said slot hole through an inlet disposed on the upper end of said slot hole, thereby making an epitaxial growth on said substrate, discharging said semiconductor solution downwards from an outlet disposed at the bottom end of said slot hole, and sequentially repeating said putting-into and discharging of semiconductor solutions of different kinds thereby sequentially making epitaxial growths.

Figure 1A:
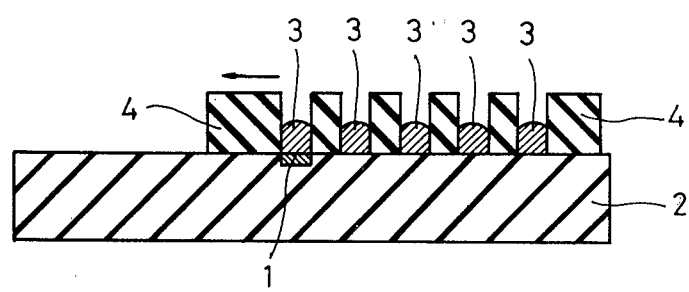
FIG. 1(a) is a schematic sectional elevation view of an apparatus of the first prior art.
Figure 1B:
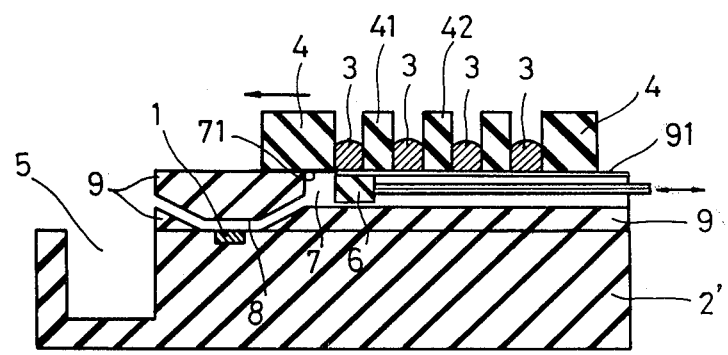
FIG. 1(b) is a schematic sectional elevation view of an apparatus of the second prior art.
Figure 2A:
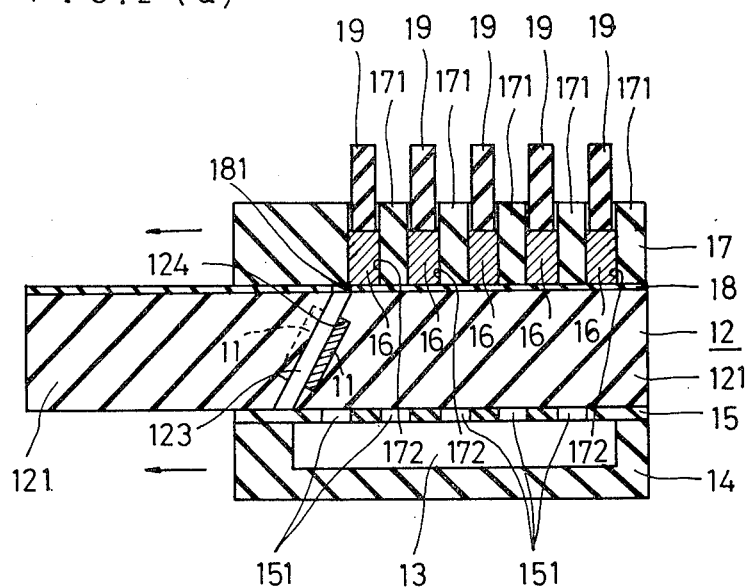
FIG. 2(a) to FIG. 2(c) are schematic sectional elevation views of an apparatus embodying the present invention, in various stages of process in accordance with the present invention.
Figure 2B:
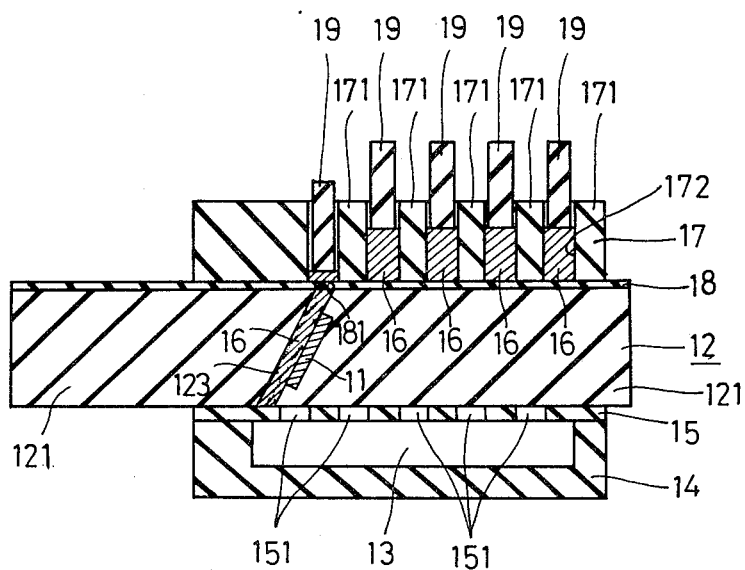
Figure 2C:
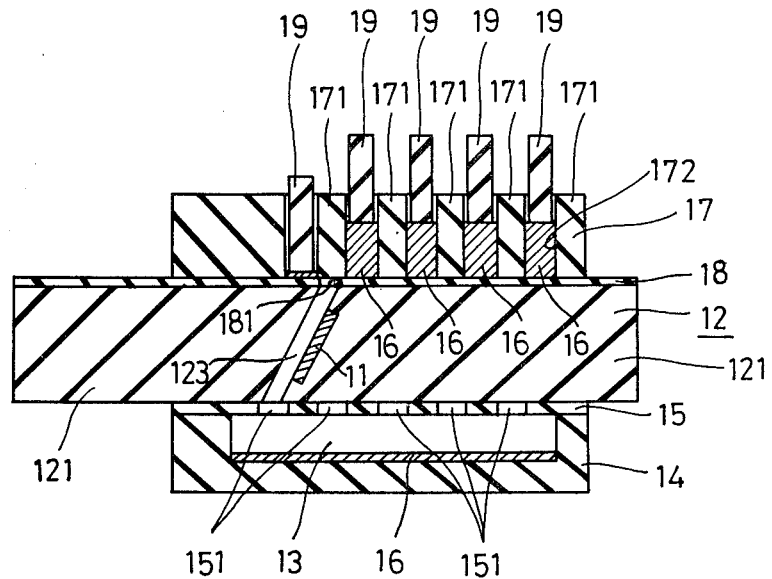

A preferred embodiment of the present invention is elucidated referring to FIGS. 2(a), 2(b) and 2(c) which show sectional elevation views of an apparatus of the present invention in various steps of the making of semiconductor devices.

The apparatus of FIGS. 2(a), 2(b) and 2(c) has a block 12, which is made of pure carbon, and a solution container 17, which is also made of pure carbon and is slidably disposed on the block 12. The block 12 has an oblique slot hole 123 defined by two substantially parallel walls. In the slot hole 123, a space or recess 124 for holding a substrate 11, for example, 35 mm×20 mm size GaAs single crystal substrate, with its principal face parallel to the axis of the slot hole 123 is formed. The size of the section of the slot hole 123 is, for example, 40 mm width×2 mm thickness. The angle of the axis of the slot hole 123 is for example 60° with respect to a horizontal plane. The angle can be larger, for example 90° (vertical) if necessary. When the angle nears, is or exceeds 90° as shown by dotted lines in FIG. 2(a), then a certain device such as a narrow frame for fixedly grasping the substrate 11 in the recess 124 is necessary. The recess 124 can be formed on both opposing faces of the slot hole 123 as shown by the solid lines and dotted lines in FIG. 2(a), so that a pair of substrates can be disposed with their principal faces to oppose each other in the slot hole 123. A cover sheet 18 having a small circular through-hole 181 of, for example 5 mm diameter, is secured on the block 12 in a manner that the through-hole 181 is on the upper end opening or inlet of the slot hole 123 and the solution container 17 can slidingly move thereon. The cover sheet 18 serves as a shutter of the inlet.

The solution container 17 has a predetermined number, for example five, of solution-containing through-holes 172, which contain solutions 16 of different kinds of semiconductor compounds or semiconductor mixed crystals. On the solutions 16 are disposed respective weights 19 for pushing out the semiconductor solutions 16 into the slot hole 123 as will be described later. An outlet sheet 15, which has a predetermined number, for example five, of through-holes 151 as outlet works as an outlet shutter. The through-holes 151 are disposed in a manner that the through-holes 151 come immediately under the bottom end of the slot hole 123 which is disposed on the bottom face of the block 12, so that the solution in the slot hole 123 is discharged through one of the through-holes 151 by adjusting the position of the outlet sheet 15 to meet the bottom end of the slot hole 123. A depository 14 is provided under the outlet sheet 15 to receive used semiconductor solutions 16 which are discharged from the slot hole 123. In the embodiment of FIG. 2, both the outlet sheet 15 and the depository 14 are fixedly connected to the solution container 17 by a frame (not shown) for the sake of a simple construction of interlockedly sliding the formers together with the latter; but any other appropriate configurations can be employed.

One example of making semiconductor epitaxial growth layers for a GaAs-Ga$_{1-x}$Al$_x$As double heterostructure semiconductor laser in accordance with the present invention, by utilizing the apparatus of FIG. 2, is elucidated hereafter. At first, as shown in FIG. 2(a), an n-GaAs substrate 11 is disposed in the recess 124 in the slot hole 123 of the block 12. The first to fifth from left to right solution containing holes 172 of the solution container 17 contains the following starting materials, respectively, of a predetermined quantities.

the Ist solution in the leftmost solution containing hole . . .

Ga as solvent metal . . . and GaAs, Al and Sn as solute to form an n-type Ga$_{1-x}$Al$_x$As solution, the IInd solution in the second left solution containing hole . . .

Ga as solvent metal . . . and GaAs as solute to form an n-type GaAs solution, the IIIrd solution in the third from the left solution containing hole . . .

Ga as solvent metal . . . and GaAs, Al and Ge as solute to form a p-type Ga$_{1-x}$Al$_x$As solution, the IVth solution in the fourth from the left solution containing hole . . .

Ga as solvent metal . . . and GaAs and Ge as solute to form a p$^+$-type GaAs solution and, the Vth solution in the rightmost solution containing hole . . .

Ga as solvent metal . . . and GaAs, Al, Sn as solute to form an n-type Ga$_{1-x}$Al$_x$As solution.

The whole system is heated in a quartz reacting tube filled with a hydrogen atmosphere to a temperature of about 845° C. so as to sufficiently resolve the starting materials to form semiconductor solutions.

Then the system is slowly cooled down at a rate of 0.1° C./minute. After 10 minutes of such cooling, the solution container 17 is slid leftwards to such a position as shown in FIG. 2(b), in a manner that the bottom of the first solution containing hole 16 and the 5 mm-diameter through-hole 181 meets. Then, by means of the first (leftmost) weight 19, the solution in the first solution containing hole 172 is pushed down into the slot hole 123. The 5 mm-diameter throughhole 181 serves to stop undesirable passing into the slot hole 123 of lumps of Ga. At this time, the outlet sheet 15 is in a position to seal the bottom outlet of the slot hole 123, so that the first solution is filled and retained in the slot hole 123, thereby contacting the principal face of the substrate and making an epitaxial growth thereon. Since the slot hole 123 has a predetermined size of its sectional area and length, the amount of the solution 16 which is put into the slot hole 123 is defined in an accurate value, and therefore, the thickness of the grown layer becomes as accurate as designed. If the solution container 17 is further slightly slid leftwards to such a position that the bottom face of a first separating wall part 171 between the first and second holes 172 seals the opening 181 of the cover sheet 18 during the period of the first epitaxial growth, then the first solution used for the first epitaxial growth is further accurately defined by being separated from excessive portion which is remaining in the first solution containing hole 172. After 30 minutes of epitaxial growth, an n-type $Ga_{0.7}Al_{0.3}As$ layer of 2.3 $\mu$m thickness is formed.

Then, the outlet sheet 15 is slightly slid leftwards, for example, by slightly sliding the solution container 17 leftwards as shown in FIG. 2(c). As a result, a first opening 151 comes immediately below the bottom end of the slot hole 123, thereby discharging the semiconductor solution in the slot hole 123 into a space 13 of the depository 14. The discharging can be made smoothly and completely by gravity. In this state, the solution container 17 is selected to be in a position that the bottom of its first separating wall seals the inlet 181 of the slot hole 123, thereby preventing any of the solution from coming into the slot hole 123.

Then, the solution container 17 is slid leftwards to such a position that the bottom of the second solution containing hole 172 to meet the through-hole 181. Therefore, by means of the second (second left) weight 19, the solution in the second solution containing hole 172 is pushed down into the slot hole 123.

Thereafter by taking similar steps as above, five epitaxial growths are made by sequentially contacting five semiconductor solutions of the five solution containing holes 172 on the substrate, thereby forming a laser of the following configuration:

| | |
|---|---|
| substrate | n$^+$-type GaAs |
| first epitaxial layer | n-type $Ga_{0.7}Al_{0.3}As$ (formed 2.3$\mu$m thick by 30 minutes growth) |
| second epitaxial layer (active layer) | n-type GaAs (formed 0.25$\mu$m thick by ¼ minutes growth), |
| third epitaxial layer | p-type $Ga_{0.7}Al_{0.3}As$ formed 1.3$\mu$m thick by 20 minutes growth), |
| fourth epitaxial layer | p$^+$-type GaAs (formed 1.0$\mu$m thick by 10 minutes growth), |
| fifth epitaxial layer (for hetero isolation to define stripe electrode) | n-type $Ga_{0.5}Al_{0.5}As$ (formed 1.2$\mu$m thick by 20 minutes growth). |

Figure 3:
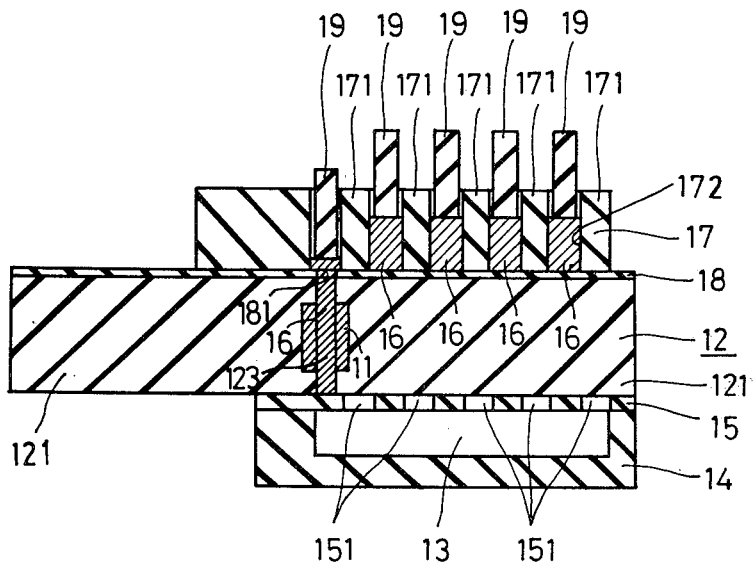
FIG. 3 is a schematic sectional elevation view of a modified embodiment of the present invention.

FIG. 3 is a schematic sectional elevation view of a modified embodiment of the present invention.

Figure 4:
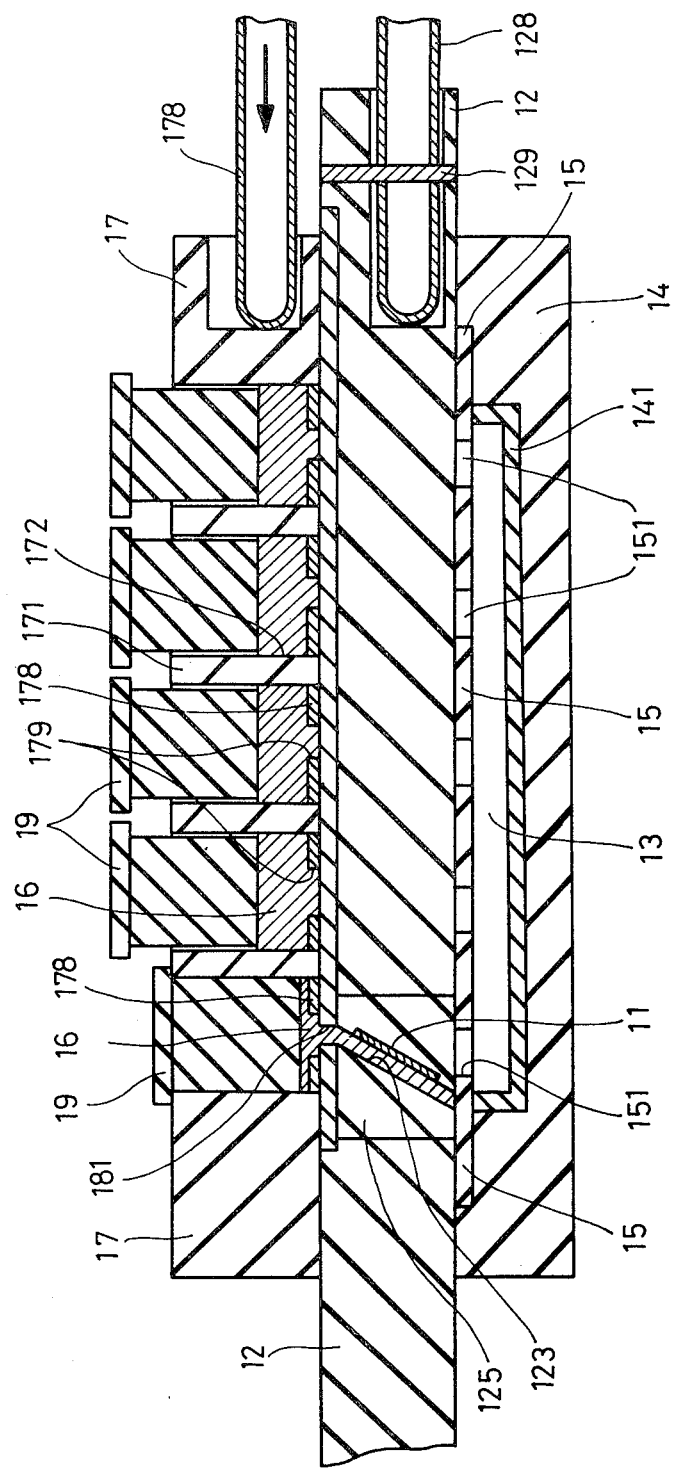
FIG. 4 is a sectional elevation view of an actual apparatus in accordance with the present inventions.

FIG. 4 shows an actual apparatus in accordance with the present invention, wherein the solution containing holes 172 have detachable bottom sheets 178 of pure carbon, each of which have a through-hole 179 which is smaller than the size of the cross-section of the solution containing hole 172. This serves, in cooperation with the small hole 181 of the cover sheet 18, to limit dropping positions of the solution container 17, which allow putting down of the solution into the slot hole 123 to a very limited regions. This enables preventing undesirable dropping of next solution into the slot hole 123 when a solution container is in a discharging position, or further, to enable sealing the inlet of the slot hole 123 during every epitaxial growths thereby to assure accurate epitaxial growths. The slot hole 123 is provided in a detachable small block 125 for interchanges for different sizes of substrates. The depository 14 has a detachable inner tray 141 of pure carbon for easy disposing of used solutions. A quartz rod 178 is for pushing the solution container 17 and another quartz rod 128 is for fixing the block 12 with a pin 129.

The method of making and apparatus of making the semiconductor device in accordance with the present invention has the following advantages:

(1) There is no need of scraping the semiconductor solution away from the surface of the substrate, and therefore, there is no possibility of damaging the surfaces of epitaxial growth layers by such scraping.

(2) The used semiconductor solutions are removed from the reacting narrow space by gravity of the solution itself, and therefore, there is no need of pushing out a used semiconductor solution by a next semiconductor solution. This enables elimination of undesirable mixing of solutions, thereby minimizing undesirable mixing of impurities or component of the compounds or mixed crystals, and also elimination of the undesirable remaining of the last solution on the substrate, resulting in prolongation of the life of the device.

(3) The construction of the apparatus and the method of using the same in making semiconductor devices are simple in comparison with the conventional bent hole type (siphon type) apparatus.

(4) By utilizing a given volume of the narrow epitaxial growth space in the block, it is possible to accurately control the volume of semiconductor solutions to be used for respective epitaxial growths.

(5) By holding the semiconductor substrate in a position to have a considerable angle with respect to a horizontal plane, it is possible to hold plural, for example two substrates in the slot hole, thereby the manufacturing apparatus can be made compact.

The apparatus and method of making semiconductors in accordance with the present invention is applicable not only to the GaAs-GaAlAs double heterostructure laser, but also generally to epitaxial growths of III-V compound such a GaP or InP, mixed III-V compound crystal such as GaAlP, InGaAs or InGaAsP, mixed PbSnTe crystals, and so on.

A very low impurity ratio (for example Al/As ratio for GaAlAs mixed crystal) is obtained when the apparatus and the method of the present invention is combined with a surface cleaning steps by utilizing a Ge-containing cleaning solution having a suitable As concentration, between two neighboring sequential steps of the first epitaxial growth of n-GaAlAs and the second epitaxial growth of p-GaAs.

What is claimed is:

1. An apparatus for making semiconductor devices comprising a block having one slot hole which includes at least one space for holding a semiconductor substrate therein, a solution container which has a predetermined number of holes with separating wall parts for isolation of said holes from each other to contain semiconductor solutions therein, said at least one space being formed in said slot hole, which is defined by two substantially parallel walls disposed at an angle with respect to a horizontal plane, said slot hole having a solution inlet at its top and a solution outlet at its bottom, said at least one space being disposed in a manner to hold said semiconductor substrate with its principal face substantially parallel to the walls of said slot hole, characterized in that said solution container is movably disposed on said block in a manner to sequentially dispose said one slot hole under one of said holes containing one of said semiconductor solutions and sequentially pour said semiconductor solutions into said slot hole from selected ones of said holes, a movable outlet sheet having a predetermined number of outlet through-holes corresponding to the predetermined number of holes in the solution container to be sequentially disposed under said solution outlet and connected to said solution container, thereby discharging one of said semiconductor solutions out of said slot hole when one of said separating wall parts closes said solution inlet, said block having secured thereto a cover sheet having one inlet through-hole superimposed on said solution inlet for being sequentially disposed under one of said holes containing said semiconductor solutions, which solutions fall down into said slot hole by gravity, said movable outlet sheet (15) with said predetermined number of outlet through-holes (151) being provided so as to control discharging of said solutions from said slot hole (123) with the capacity of each of said holes (172) in said solution container being larger than the capacity of said slot hole (123) thereby allowing said solution (16) to extend upwards continuously to the lower part of said hole (172) when a solution (16) is led into said slot hole (123).

2. An apparatus for making semiconductor devices in accordance with claim 1, in which said outlet sheet and said solution container are connected by an interlocking means with each other, in a manner that said outlet through-holes in said outlet sheet are closed at least when the one inlet through-hole in said cover sheet is open.

3. An apparatus for making semiconductor devices in accordance with claim 2, wherein said interlocking means connects said outlet sheet and said solution container in a manner such that the one inlet through-hole in said cover sheet is closed for a selected part of a period during which said outlet through-holes in said outlet sheet are open.

4. An apparatus for making semiconductor devices in accordance with claim 1 or 2, wherein said principal face of said semiconductor substrate which is substantially parallel to the walls of said slot hole is disposed tilting upwards.

5. An apparatus for making semiconductor devices in accordance with claim 4 wherein said solution-containing holes have weights to push the solutions away into said slot hole.

6. An apparatus for making semiconductor devices in accordance with claim 4, wherein said solution container is provided with detachable bottom sheets with one through-hole for each one of said predetermined number of holes, a diameter of said each one of said through-hole being smaller than that of said predetermined number of holes.

7. An apparatus for making semiconductor devices in accordance with claim 1, 2 or 3 wherein said space comprises two substrate holders for holding a pair of said substrates with their principal faces opposing each other.

8. An apparatus for making semiconductor devices in accordance with claim 7 wherein said solution-containing holes have weights to push the solutions away into said slot hole.

9. An apparatus for making semiconductor devices in accordance with claim 1, 2 or 3 wherein said solution-containing holes have weights to push the solutions away into said slot hole.

10. An apparatus for making semiconductor devices in accordance with claim 1, 2, or 3, wherein said solution container is provided with detachable bottom sheets with one through-hole for each one of said predetermined number of holes, a diameter of said each one of said through-hole being smaller than that of said predetermined number of holes.

* * * * *